(12) United States Patent
Mirow et al.

(10) Patent No.: US 6,194,882 B1
(45) Date of Patent: Feb. 27, 2001

(54) VOLTAGE SUPPLY FOR A SENSOR

(75) Inventors: Georg Dieter Mirow, Abtsweg 15, D-69198 Schriesheim; Tilmann Krueger, Mutterstadt, both of (DE)

(73) Assignee: Georg Dieter Mirow, Schriesheim (DE)

( * ) Notice: Subject to any disclaimer, the term of this patent is extended or adjusted under 35 U.S.C. 154(b) by 0 days.

(21) Appl. No.: 09/463,745

(22) PCT Filed: Jul. 24, 1998

(86) PCT No.: PCT/EP98/04694

§ 371 Date: Jan. 31, 2000

§ 102(e) Date: Jan. 31, 2000

(87) PCT Pub. No.: WO99/07058

PCT Pub. Date: Feb. 11, 1999

(30) Foreign Application Priority Data

Jul. 30, 1997 (DE) ................................ 197 32 766

(51) Int. Cl.⁷ ................................ G05F 1/40; G05F 1/10
(52) U.S. Cl. .............................. 323/282; 323/222
(58) Field of Search .................................. 323/222, 266, 323/271, 282, 283; 363/16, 20, 21

(56) References Cited

U.S. PATENT DOCUMENTS

| 4,454,558 | * | 6/1984 | Huddart | 361/153 |
|---|---|---|---|---|
| 4,688,157 | | 8/1987 | Rischmuelle | 363/20 |
| 5,264,780 | | 11/1993 | Bruer et al. | 323/222 |
| 5,717,320 | * | 2/1998 | Heeringa et al. | 323/282 |
| 5,942,883 | * | 9/1999 | Preis et al. | 323/282 |

FOREIGN PATENT DOCUMENTS

| 0 189 340 | 7/1986 | (EP) . |
|---|---|---|
| WO 87 03150 | 5/1987 | (WO) . |

OTHER PUBLICATIONS

Patent Abstracts of Japan, vol. 008, No. 239 (E–276), Nov. 2, 1984 & JP 59 117459 A (Hitachi Seisakusho KK), Jul. 6, 1984.

Patent Abstracts of Japan, vol. 008, No. 247 (E–278), Nov. 13, 1984 & JP 59 123461 A (Nippon Condenser Kogyo KKK), Jul. 17, 1984.

Peltz; Single–coil Voltage Converters From 9 V to 150 V; Electronics; 24/1981; p. 76 (English Summary attached).

* cited by examiner

Primary Examiner—Matthew Nguyen
(74) Attorney, Agent, or Firm—Foley & Lardner

(57) ABSTRACT

According to the invention, sensors which require a high voltage supply and require little current at least for temporary periods are supplied by an blocking oscillator with a high degree of efficiency. The efficiency of said blocking oscillator is due to the low inverse current of the rectifier, the blockage recovery time being short at the same time, the low consumption of the controlling system, and economical and therefore inexpensive voltage measurement. In particular, batteries with an especially long life can be used.

11 Claims, 2 Drawing Sheets

VOLTAGE SUPPLY FOR A SENSOR

BACKGROUND OF THE INVENTION

1. Field of the Invention

The invention relates to a method for supplying voltage to a sensor from energy sources having little energy, and to devices for use of the method. The following statements are based on a Geiger-Müller counting tube for detection of radioactive radiation, as an example of such a sensor. However, it should be mentioned that the invention is not limited to sensors, but may also be used, for example, for supplying voltage to other loads, particularly if such loads draw only a very small amount of current at a voltage of more than 100 volts.

2. Description of the Related Art

A number of methods are known for supplying voltage to sensors. These can be divided into open-loop and closed-loop controlled voltage converters.

Typical open-loop controlled voltage supplies include single-ended forward converters and push-pull choppers, in which the primary voltage is converted to the secondary voltage with a fixed transformation ratio.

Single-ended flyback converters store a certain amount of energy in the inductor during a primary pulse, which switches on a switching transistor or some other suitable switch for the duration of the primary pulse, and thus produce a rising current in a circuit which essentially comprises a primary energy source, for example a battery, an inductor and a switch, which energy is emitted on the secondary side via a rectifier once the primary pulse has been switched off. If the load on the secondary side is known, it is thus also possible to control the secondary voltage that is achieved, for example by taking account of the power that results from the load on the secondary side by suitably defining the primary pulse rate and primary pulse duration. If there is no load on the secondary side, the voltage theoretically rises in an unlimited fashion, but in practice it is limited by a charge flowing back owing to the rectifier not having a blocking response, and/or owing to the limited withstand voltage of the circuit, caused, for example, by the switching transistor having an inadequate blocking capability, or by voltage flashovers in the inductor or in any energy-storage capacitor that is used. If the load on the secondary side is unknown, then, in order to avoid circuit malfunctions or damage to components, the secondary voltage is generally regulated or limited, particularly if it is intended to be at a specific value or, at least, is not intended to exceed such a value. The secondary voltage is also often limited by parasitic characteristics of components, such as the avalanche effect of diodes, the capacitance of the inductor, and the reverse current of the rectifier. While a voltage supply according to the prior art offers satisfactory efficiency for a load drawing a medium or high amount of current, this is not the case for a load drawing a particularly low current.

Geiger-Müller counting tubes are loads which, for optimum measurement accuracy, must be supplied with a constant voltage over a wide required current range. For example, the current required for a typical counting tube for an optimum measurement voltage of 500 volts when there is no radiation is 0.25 nA, but is 15 µA for maximum radiation, corresponding to a ratio of 1:60,000.

For example, G. Peltz, Single-coil voltage converters from 9 V to 150 V, Electronics 24/1981, page 76, describes how a supply current of more than 2 milliamperes is drawn from the primary energy source even for a low voltage conversion ratio with a factor of about 15, even when there is no load. This article describes how high-frequency burst rates are used to produce the output voltage, and what is meant by the term "good efficiency" according to the prior art. For example, the efficiency is stated to be 70 percent for an output load of one milliampere.

The previously known methods are subject to many problems which severely load the primary energy source, for example a battery, and thus limit the possible operating period, since the current supplies to test equipment for measuring radioactive radiation using a Geiger-Müller counting tube as the sensor cannot provide for the small amount of current required by the sensor when the radiation is low, with high efficiency. This is particularly true if it is also intended that the supply voltage for the sensor should not collapse at maximum radiation.

Thus, for battery-operated test equipment, it is impossible to measure and record the radiation over a lengthy period, without having to replace or charge the battery regularly.

With regard to the prior art, reference should also be made to the following literature. It is known from JP 59117459 for a plurality of diodes to be connected in series in order to be able to use such a low reverse voltage, and EP-A-0 189 340 likewise discloses a parallel circuit of two diodes, in order to reduce oscillations during the change to the reverse-biased zone. On the other hand, neither circuit allows the reverse current to be reduced.

SUMMARY OF THE INVENTION

The object of the invention is to avoid the disadvantages of the known methods and equipment and to allow, on the one hand, measurements which are as accurate as possible to be carried out for as long a time as possible without any maintenance penalty while, on the other hand, providing precise long-term detection and recording of the measured radiation.

According to the invention, the above object is achieved by devices in accordance with one or more of claims 1 to 10. A flyback converter, for example, is used to produce the voltage. According to the invention, the rectifier of the flyback converter is designed for a low reverse current and to switch on quickly.

In one embodiment of the invention, the measurement of the voltage that is produced is replaced by fast and suitably synchronized measurement of the voltage at the switch.

In one refinement of the invention, the time of the next required primary pulse is estimated in the regulating device, and the regulating device is switched off until then.

In a further refinement of the invention, the voltage measurement and the control response are carried out by a microcontroller, which controls the sensor operation and also carries out the evaluation, indication and recording of the sensor signal.

Further advantageous refinements result from the following description of an exemplary embodiment.

DETAILED DESCRIPTION OF PREFERRED EMBODIMENTS

The prior art is distinguished by radiation test equipment that is currently available on the market and already achieves a current draw of a few milliamperes at operating voltages of 3 to 9 volts. Major problems result from the current drawn by the regulating device, the current required for voltage measurement, the reverse current of the rectifier and the energy losses in the time during which the rectifier is changing from being switched on to being switched off.

Figure 1:
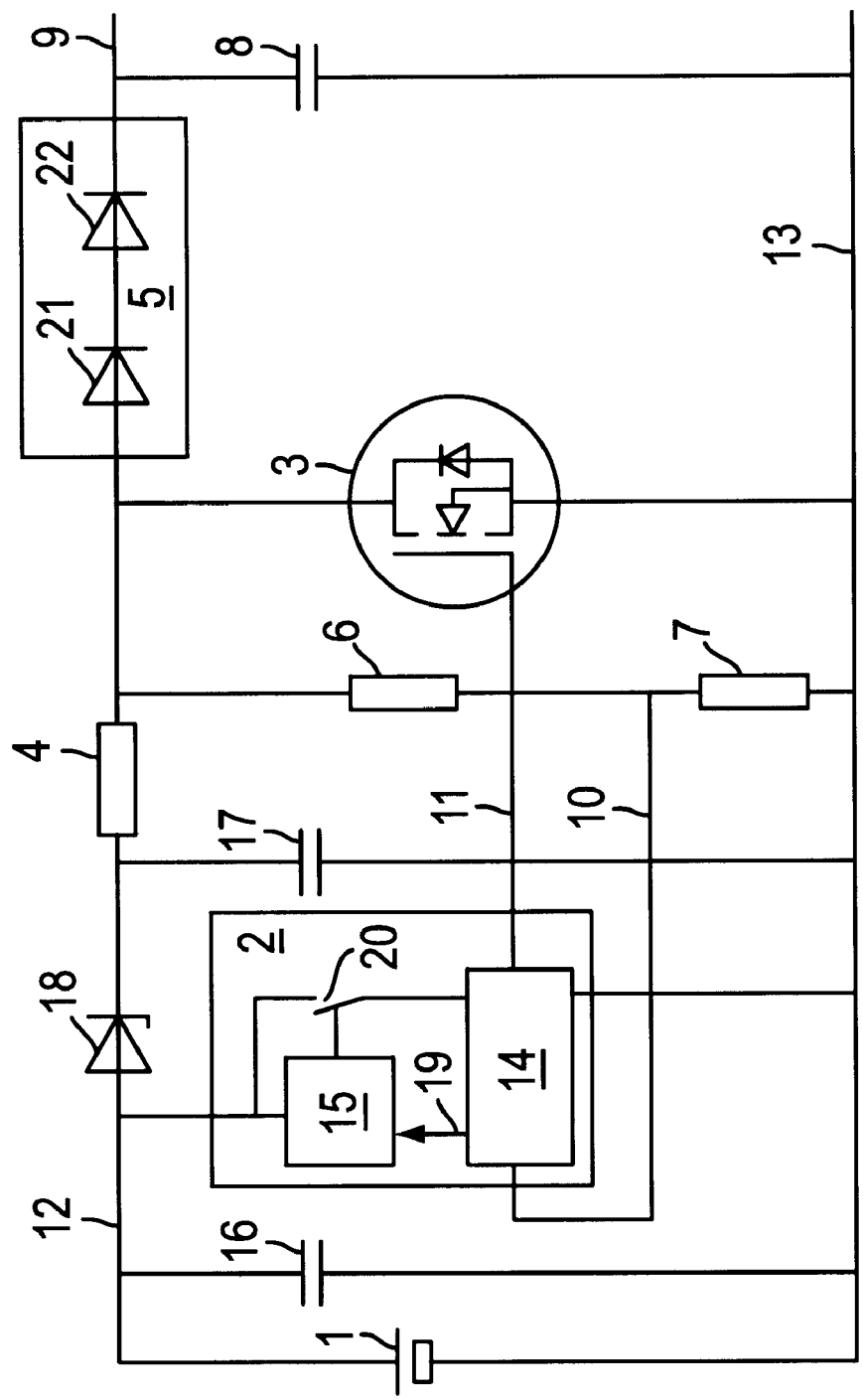
FIG. 1 shows a typical device for carrying out the method according to the invention.
Figure 2:
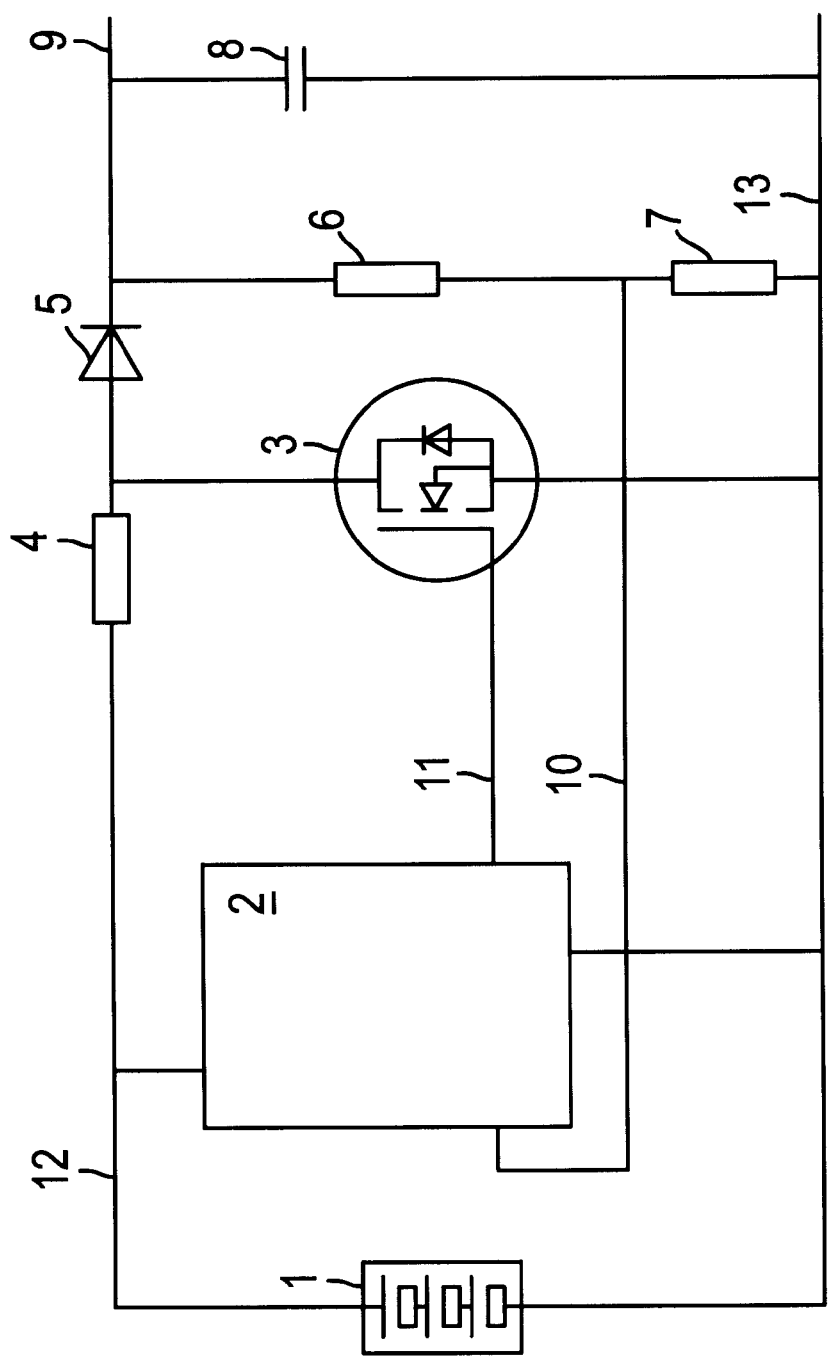
FIG. 2 shows a typical circuit according to the prior art.

As far as possible, the two FIGS. 1 and 2 are shown such that they match one another. In FIGS. 1 and 2, the battery 1 supplies the circuit with the operating voltage 12. The regulating device 2 processes the measurement signal 10 which the voltage divider (formed by the resistors 6 and 7) obtains from the output voltage 9 (FIG. 2) or the voltage at the switching transistor 3 (FIG. 1), and produces the control signal 11 for the switching transistor 3. When this switching transistor 3 is switched on, the operating voltage 12 is applied to the inductor 4. The current through this inductor 4 thus rises, and magnetic energy is increasingly stored in it, to be precise until the switching transistor is switched off. Since the inductance of the inductor 4 prevents the current changing rapidly, the voltage across it increases until a value is reached which corresponds to the output voltage 9 plus the forward voltage of the rectifier 5, and thus charges its own parasitic capacitance in the inductor 4. Charging current now flows into the capacitor 8 until the magnetic energy stored in the inductance of the inductor 4 is used up. The time required for this is in this case called the capacitor charging time. If the output voltage 9 is low, this time is long, and if the output voltage is high it is short.

The rectifier 5 needs a certain amount of time to switch off again, the so-called recovery time. Until this has elapsed, the output voltage 9 drives an increasing current through the inductor 4 in the opposite direction, the capacitor 8 is partially discharged, and the inductor 4 is charged with magnetic energy in the opposite direction. When the rectifier 5 switches off again, then the current flows into the battery 1 once again, to be precise from the transistor 3 which is now operated in the inverse sense, until the magnetic energy has been dissipated.

If the battery 1 is formed by rechargeable batteries, then the reverse charging produced in this way is not a problem. However, if the battery comprises cells which are especially suitable for many years of maintenance-free operation, such as lithium thionyl chloride cells, then the life is reduced.

Furthermore, the recovery time limits the maximum achievable output voltage 9 since, as the output voltage 9 rises, the capacitor charging time is reduced in a known manner. If no current is drawn whatsoever, for example owing to non-ideal insulation, diode reverse current or sensor current, from the output voltage 9, then the maximum limit value is reached, at which the capacitor charging time is equal to the recovery time since the charge supplied to the capacitor is then equal to the charge drawn from it for each primary pulse. This behavior, which is actually disadvantageous, is accepted in particularly simple applications; it ensures that the output voltage 9 is limited, and thus makes it possible to dispense with complex measurement of the output voltage 9 from the voltage supply.

Very low duty ratios are typical for flyback converters for supplying Geiger-Müller counting tubes, that is to say long pause times in comparison with the pulse durations. In the pause times, the reverse current flows through the rectifier. For typical rectifiers, this is a few microamperes even at room temperature, for example about 5 $\mu$A at 25° C., 50 $\mu$A at 125° C. for diodes of 1N4007 type, that is to say many times the currents required by the sensor of, for example, 0.25 nA. Thus, for typical applications at the moment, the change in the load on the flyback converter resulting from changes in the sensor current is generally of secondary importance in comparison to changes in the rectifier reverse current owing to its dependence on temperature. Since the output voltage 9 is often well above one hundred times the operating voltage 12, this results in the average current required from the battery 1 being increased by well above one hundred times, that is to say, for example, in the order of magnitude of 1 mA. It is thus not possible to achieve operation over several years with a cell having a capacity of, for example, 2 Ah.

Commercially available diodes with a short recovery time have relatively high reverse currents, while diodes with a particularly small reverse current have long recovery times. In order to achieve high efficiency, long capacitor charging times could be used in conjunction with diodes having a particularly low reverse current. However, there are major difficulties in achieving long capacitor charging times, since this necessitates large inductances which, as a rule, also have relatively large parasitic capacitances. Even with an inductance of 100 mH and a operating voltage of 3 V, the current rises to 30 mA in 1 ms. If the ratio of the output voltage to the operating voltage is 150, the current in the inductance falls linearly from the initial value of 30 mA to zero in less than 7 $\mu$s. If the inductor has a parasitic capacitance of only 150 pF, more than 1 $\mu$s of this is lost, to be precise the portion with the highest current. The maximum possible capacitor charging time thus lasts for less than 6 $\mu$s, starting with a capacitor charging current which is now only 25 mA.

The circuit consumes a considerable amount of power in order to measure the output voltage 9. For conventional regulating devices, control variables in the order of magnitude of 1 V are required. The output voltage 9 is thus reduced to the required value by the voltage divider, which comprises the resistors 6 and 7. It is extremely costly to use extremely high-value stable resistors. Resistors up to about 10 M$\Omega$ can be obtained cheaply. The measurement current is thus, for example, in the order of $\mu$A, that is to say considerably more than the current drawn by the sensor itself.

A typical arrangement of a refinement of the invention is shown in FIG. 1.

In comparison to the prior art shown in FIG. 2, the battery 1 in FIG. 1 is formed by an individual cell with a high voltage and long life, for example an AA size lithium thionyl chloride cell, also called a Mignon, with a life of more than ten years, a capacity of 2 Ah, and a voltage of 3.7 V. The danger to this cell from reverse charging as mentioned above is avoided by two buffer capacitors 16 and 17, as well as the Schottky diode 18. The latter can be replaced by a suitably controlled switch, for example a field-effect transistor, which can be actuated in parallel with the transistor 3, by which means it is possible to provide the current for magnetization of the inductor from the primary energy source and the two capacitors 16 and 17. When the controlled switch is switched off, the capacitor 17 just has to carry the charging current for the capacitor 8 on its own, with a charge of 0.5×7 $\mu$s×30 mA=105 nC being required for the values mentioned above, so that the voltage drop for a capacitance of 22 $\mu$F is thus 4.77 mV. The capacitor 17 also has to absorb the reverse charging, for example corresponding to 10% of the magnetic energy initially stored in the inductor 4, that is to say, even ignoring the voltage increase resulting from this, 0.1×0.5×1 ms×30 mA=1.5 $\mu$C, corresponding to a voltage increase across the capacitor 17 of 68 mV. The capacitor 16 relieves the battery 1 of the reverse currents of the Schottky diode 18 on the one hand and, together with the capacitor 17, when providing the current for storage of magnetic energy in the inductor 4 on the other hand.

In comparison to the prior art shown in FIG. 2, the regulating device 2 is provided by a pulse transmitter 14, which programs a time switch 15 by transmission of a switched-off time 19, such that the supply of the pulse transmitter through the switch 20 is switched off during this time. Such a regulating device may be provided, for example, by a microcontroller with so-called low-power modes. In a further preferred refinement of the invention, this microcontroller also carries out other functions, such as activation of the sensor only at specific times or as a function of the remaining battery capacity, or an indication, dose calculation and recording of the sensor's measured values.

In comparison to the prior art shown in FIG. 2, the output voltage 9 is measured upstream of the rectifier. Thus, although the required measurement current does not change, its time duration does, since it now flows only during the capacitor charging time and the recovery time. This results in a signal duration of a few microseconds. The problem thus [lacuna] itself in assessment of the signal can be solved by using a sample-and-hold circuit or a fast analog/digital converter. In one preferred refinement of the invention, an analog/digital converter in the microcontroller and having a relatively slow sample-and-hold circuit is used, with, according to the invention, the control signal 11 being synchronized to the analog/digital converter, to be precise such that its sample-and-hold circuit starts to sample the measured value some time before the control signal 11 is switched on, and thus ends this sampling process once a fixed time has elapsed, such that the capacitor charging time has not yet ended even at the maximum output voltage 9 that is still to be measured. Thus, irrespective of the capacitor charging time, if the effective sampling time of the measurement signal 10 is shorter than the time required for the sample-and-hold circuit to start to oscillate, it is still related to it by a fixed ratio. An appropriate correction can be carried out in a generally known manner, based on the ratio of the effective sampling time of the measurement signal 10 to the time constants of the sample-and-hold circuit.

In comparison to the prior art shown in FIG. 2, the rectifier 5 is formed by two diodes 21 and 22, with the diode 22 on the output side having a particularly low reverse current while dispensing with a particularly short recovery time, and the diode 21 having a particularly short recovery time while dispensing with a particularly low reverse current. Toward the end of the capacitor charging time, both diodes 21 and 22 first of all carry current. When the current reverses, the diode 21 is the first to reach its recovery time, and to switch off. After this, the diode 22 will slowly become reverse-biased but, since the reverse current is low in comparison with that of the diode 21, this will govern the reverse current of the rectifier 5 for the majority of the pause time between two pulses. overall, the reverse current of the diode 21 will flow for a few microseconds, and that of the diode 22 will flow for the rest of the pause time. The proposed arrangement of the diode 22 on the output side also allows the circuit leakage current to be minimized. In one preferred refinement of the invention, the connection on the output side, the cathode, of the diode 22 is no longer connected to the printed circuit board, but directly to a self-supporting connection of the energy-storage capacitor 8. This avoids leakage currents caused by the printed circuit board, which can easily reach the same order of magnitude as the sensor current.

A particularly advantageous refinement of the invention is achieved by combination of the features described in claims 1 to 11 [sic], in the refinement described below:

A cell having a particularly long life and high energy is used as the primary energy source 1, for example a lithium thionyl chloride cell.

The regulating device 2 is formed by a measurement signal processor, which contains an analog/digital converter for evaluating the measurement signal 10 (which is essentially proportional to the voltage across the capacitor 8 as the output voltage from the flyback converter), executes the control algorithms for regulating the flyback converter with production of the control signal 11, and is equipped with a timing circuit. The timing circuit is used to define the primary pulse duration of the control signal 11 and to switch off all those regulating device components which are not required during the primary pulse pause. The synchronization of the measurement to the time when the switching transistor 3 changes to the switched-off state is achieved in the measurement signal processor in that, toward the end of the primary pulse duration, the analog/digital converter is started first of all, and the primary pulse is then ended after a specific time. After the end of analog/digital conversion of the measurement signal 11, the control algorithm is executed, and thus defines the interval before the next primary pulse.

Additionally and inter alia, the measurement signal processor carries out administration of the real time, comprising the date and clock time, evaluation of the sensor signal, which is not shown in FIG. 1, presentation of desired values on a display, recording of desired variables, and evaluation of a control keyboard.

The computation time required for this is short in comparison to the appliance operating period. In the time which is not required for pulse production or for calculations, the measurement signal processor is switched to a standby mode, in which only the timing circuit and a counter for detecting a signal produced by the sensor are active, and which is distinguished by the current drawn being extremely low.

The primary energy source 1 is assisted by a capacitor 16, preferably a ceramic capacitor having a very high capacitance, very low leakage current and low internal resistance. It is thus possible to use as the primary energy source cells which, by virtue of a passivation effect, have a particularly long life but unfortunately can also produce a relatively high internal resistance, since the capacitor 16 can provide the charge required to magnetize the inductor 4 with only a small drop in voltage, and can be charged again in the relatively long pauses between two primary pulses. The capacitor 17, preferably a ceramic capacitor having a very high capacitance, very low leakage current and low internal resistance, provides the reverse current for the rectifier 5 as well as the further current, caused by this, in the inductor 4, which flows via the freewheeling diode of the switching transistor 3 and assists the capacitor 16 in magnetization of the inductor. The diode 18 prevents any reverse current to the primary energy source 1 and decouples the circuit formed by the capacitor 17, the inductor 4 and the switching transistor 3 from the supply (formed by the primary energy source 1 and the capacitor 16) to the regulating device 2 during the primary pulse to the level of the conducting-state voltage of this diode 18. The diode 18 may have a relatively high-value resistor connected in parallel with it, which ensures that the capacitor 17 is charged to the voltage of the capacitor 16 during the relatively long pause in the primary pulse, without any risk of significant reverse current.

The rectifier 5 comprises two different diodes, with the diode 22 on the output side being provided with a particularly low reverse current while dispensing with a particularly short recovery time, and the diode 21 being provided with a particularly short recovery time, while dispensing with a particularly low reverse current.

The area with the output voltage 9, that is to say the area between the output side of the diode 22, that is to say its cathode in FIG. 22, the connection of the capacitor 8 and the connection of the sensor, as the load, on the high-voltage side, is particularly well isolated from the rest of the circuit, for example by free wiring in space, by large separations on a printed circuit board on which the circuit is fitted, and/or by suitable slots in the printed circuit board.

The voltage divider comprising the resistors 6 and 7 divides the voltage across the switching transistor 3 and is formed from a very high-value resistor 6 and a low-value resistor 7. In this case, care must be taken to ensure that the resistor 6 is not capacitively loaded and is not inductive due to other components or the printed circuit board since, otherwise, the voltage divider will have a low-pass response. During the on-phase of the rectifier 5, the voltage across the switching transistor 3 corresponds very well to the output voltage 9, and, during the off-phase, it corresponds to the operating voltage 12.

The particularly advantageous embodiment of the invention described above has been produced as radiation test equipment with a Geiger-Müller counting tube, a keyboard and a liquid crystal display. When the radiation is not excessively strong, this appliance overall requires only a mean current of about 10 microamperes, which is supplied by the battery, and is thus 100 times better than solutions according to the prior art. The appliance can thus no longer be switched off, since the life is no longer governed by the current drawn, but only by the life of the sensor, and is well over 10 years.

| LIST OF REFERENCE SYMBOLS | |
| --- | --- |
| 1 | Battery |
| 2 | Regulating device |
| 3 | Switching transistor |
| 4 | Inductor |
| 5 | Rectifier |
| 6, 7 | Resistor |
| 8 | Energy-storage capacitor |
| 9 | Output voltage |
| 10 | Measurement signal |
| 11 | Control signal |
| 12 | Operating voltage |
| 13 | Reference ground |
| 14 | Pulse transmitter |
| 15 | Time switch |
| 16, 17 | Buffer capacitor |
| 18 | Schottky diode, switching transistor |
| 19 | Switched-off time |
| 20 | Switch |
| 21, 22 | Diode |

What is claimed is:

1. Method for supplying voltage for a high-impedance load from a high voltage, in which case the high voltage (9) is produced from a low voltage (12) using a flyback converter which, when a switching transistor (3) in the flyback converter changes to the switched-off state, supplies charge to a energy-storage capacitor (8), via a rectifier (5), by means of a current which is maintained by an inductor (4) in the flyback converter, characterized in that the charge flowing out via the rectifier (5) in the reverse direction is limited in the rectifier (5) by means of a diode which has a low reverse current and by means of a further diode which has a short recovery time.

2. Apparatus according to claim 1, characterized in that the rectifier (5) of the flyback converter comprises at least one diode (22) having a low reverse current and at least one diode (21) having a short recovery time.

3. Apparatus according to claim 1, characterized in that the voltage (9) produced by the flyback converter is measured at the switching transistor (3), the measurement is synchronized to the time when the switching transistor (3) changes to the switched-off state, and the measurement result is used to control/regulate the flyback converter.

4. Apparatus according to claim 1, characterized in that the voltage applied to the switching transistor (3) and produced by the flyback converter is matched by means of a voltage divider (6, 7) to the control input of the pulse transmitter.

5. Apparatus according to claim 1, characterized in that the pulse transmitter (14) of the flyback converter is switched off between the primary pulses of the control signal (11).

6. Apparatus according to claim 1, characterized in that the charge flowing out from the energy-storage capacitor (8) via the rectifier (5) is absorbed by a further capacitor (17).

7. Apparatus according to claim 6, characterized in that the charge in the flyback converter which flows out via the rectifier (5) is prevented by means of a switch or a diode from flowing back into the battery.

8. Apparatus according to claim 1, characterized in that the regulating device is produced using a microcontroller.

9. Apparatus according to claim 8, characterized in that the microcontroller has an analog/digital converter for detecting the output voltage produced by the flyback converter.

10. Apparatus according to claim 8, characterized in that the microcontroller carries out other functions for activation of a load supplied by the flyback converter, or for processing its values.

11. Apparatus according to claim 6, characterized in that, in time periods in which no primary pulse is produced, the output voltage (9) is not measured and further functions for a supplied load are not carried out, the microcontroller switches off the pulse transmitter in the flyback converter, and itself assumes a standby mode.

* * * * *

UNITED STATES PATENT AND TRADEMARK OFFICE
CERTIFICATE OF CORRECTION

PATENT NO. : 6,194,882 B1
DATED : February 27, 2001
INVENTOR(S) : Mirow et al.

It is certified that error appears in the above-identified patent and that said Letters Patent is hereby corrected as shown below:

<u>Title page,</u>
Item [22], PCT Filing Data, "July 24, 1998" should read -- July 27, 1998 --.

Signed and Sealed this

Nineteenth Day of March, 2002

Attest:

JAMES E. ROGAN
*Attesting Officer*  *Director of the United States Patent and Trademark Office*